US010658531B2

(12) United States Patent
Bedell et al.

(10) Patent No.: US 10,658,531 B2
(45) Date of Patent: May 19, 2020

(54) SPALLING TECHNIQUES FOR MANUFACTURING PHOTODIODES

(71) Applicant: International Business Machines Corporation, Armonk, NY (US)

(72) Inventors: Stephen W. Bedell, Wappingers Falls, NY (US); James R. Kozloski, New Fairfield, CT (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 15/787,174

(22) Filed: Oct. 18, 2017

(65) Prior Publication Data
US 2019/0115485 A1 Apr. 18, 2019

(51) Int. Cl.
H01L 21/00 (2006.01)
H01L 31/0304 (2006.01)
H01L 31/18 (2006.01)
H01L 31/107 (2006.01)
G01T 1/00 (2006.01)
H01L 31/115 (2006.01)

(52) U.S. Cl.
CPC ......... H01L 31/03044 (2013.01); G01T 1/00 (2013.01); H01L 31/107 (2013.01); H01L 31/115 (2013.01); H01L 31/1848 (2013.01); H01L 31/1856 (2013.01); H01L 31/1892 (2013.01)

(58) Field of Classification Search
CPC .................. H01L 31/03044; H01L 31/1848
See application file for complete search history.

(56) References Cited

U.S. PATENT DOCUMENTS

| 8,709,914 | B2 | 4/2014 | Bedell et al. | |
| 8,748,296 | B2 | 6/2014 | Bedell et al. | |
| 9,412,663 | B1* | 8/2016 | Andry | H01L 21/78 |
| 9,748,353 | B2 | 8/2017 | Bedell et al. | |
| 2002/0039374 | A1* | 4/2002 | Onomura | B82Y 20/00 |
| | | | | 372/46.01 |
| 2004/0200975 | A1* | 10/2004 | Brown | G01J 1/429 |
| | | | | 250/372 |
| 2010/0072398 | A1* | 3/2010 | Fruehauf | G01T 1/00 |
| | | | | 250/487.1 |

(Continued)

OTHER PUBLICATIONS

E. Cicek, Z. Vashaei, R. McClintock, C. Bayram, and M. Razeghi, "Geiger-Mode operation of ultraviolet avalanche photodiodes grown on sapphire and free-standing GaN substrates," Applied Physics Letters 93, 261107 (2010), 3 pages.

(Continued)

Primary Examiner — Seahvosh Nikmanesh
(74) Attorney, Agent, or Firm — Patterson + Sheridan, LLP

(57) ABSTRACT

A photodiode fabricated using spalling techniques, and method for making the same. The photodiode including a substrate, an optical device semiconductor material layer disposed over the substrate, a p-type contact disposed over the optical device semiconductor material layer, an n-type contact disposed over the substrate, and an adhesion layer for rear illumination adhered to the bottom of the substrate. Both the substrate and the optical device semiconductor material layer comprise at least one of GaN, AlGaN or AlN.

13 Claims, 7 Drawing Sheets

(56) References Cited

U.S. PATENT DOCUMENTS

| | | | | |
|---|---|---|---|---|
| 2010/0311250 A1* | 12/2010 | Bedell | ................ | H01L 31/0725 |
| | | | | 438/759 |
| 2014/0242807 A1* | 8/2014 | Bedell | ............... | H01L 21/02318 |
| | | | | 438/759 |
| 2014/0291682 A1* | 10/2014 | Huang | ................ | H01L 31/1075 |
| | | | | 257/55 |
| 2015/0187970 A1* | 7/2015 | Curry | ................ | H01L 31/03044 |
| | | | | 250/552 |
| 2016/0183358 A1* | 6/2016 | Al-Saud | ................ | H05K 1/028 |
| | | | | 174/261 |

OTHER PUBLICATIONS

Tut el al., "Solar-blind AlxGa1-xN-based avalanche photodiodes," Appl. Phys. Letter 87,223502 (2005), 4 pages.

McClintock et al.,"Solar-blind avalanche photodiodes," Center for Quantum Devices; Department of Electrical Engineering and Computer Science; Northwestern University; 2006, 10 pages.

Charles L. Melcher, "Scintillation Crystals for PET*," jnm.snmjournals.org, [Accessed on Jul. 6, 2017], 6 pages.

* cited by examiner

UV LIGHT

SPALLING TECHNIQUES FOR MANUFACTURING PHOTODIODES

BACKGROUND

1. Technical Field

The present invention relates to applying spalling applications to the manufacture of optical semiconductor devices, and more particularly, to techniques for integrating spalling into the development of photodiodes.

2. Related Art

The material used to make a photodiode is critical to defining its properties. This is mainly because only photons with sufficient energy to excite electrons across the material's bandgap will produce significant photocurrents.

Accordingly, there is a need to improve upon the material composition and method of making photodiodes in general, which can include as a subset, photodetectors.

SUMMARY

In one example, a photodiode structure is provided. The photodiode structure includes: a substrate, an optical device semiconductor material layer over the substrate, a p-type contact over the optical device semiconductor material layer, an n-type contact over the substrate, and an adhesion layer for rear illumination adhered to the bottom of the substrate, where both the substrate and the optical device semiconductor material layer comprise at least one of GaN, AlGaN or AlN. According to one embodiment, such a device could be used for compact and efficient gamma-ray detectors used in positron emission tomography (PET) imaging when optimized for single photon detection.

A method for forming an optical semiconductor device is also provided. The method includes the steps of: forming an optical device semiconductor material layer on a substrate, depositing a metal stressor layer on top of the optical device semiconductor material layer, attaching a first handle layer to the metal stressor layer, removing the optical device semiconductor material layer from the substrate by pulling the first handle layer away from the substrate and with it a stack comprising the metal stressor layer and a portion of the substrate, forming a rear handle layer on the remaining portion of the semiconductor substrate, wherein the rear handle is UV transparent, and removing the first handle layer and the metal stressor layer from the stack.

A method for forming an optical semiconductor device is also provided. The method includes the steps of: forming photodiode stack on a substrate, which includes at least one optical device material layer, depositing a metal stressor layer on top of the photodiode material stack, where the metal stressor layer is deposited to a thickness sufficient to permit mechanically-assisted spalling of the optical device semiconductor material layer to occur; attaching a handle layer to the metal stressor layer, removing the photodiode material stack, the optical device semiconductor material layer, and a portion of the substrate from a remainder of the substrate by pulling the first handle layer away from the substrate, the photodiode material stack, and the portion of the substrate, and attaching a second handle layer to the portion of the substrate, where the second handle layer is suitable for illumination, and removing the first handle layer and the metal stressor layer from the stack.

DETAILED DESCRIPTION

Figure 1:
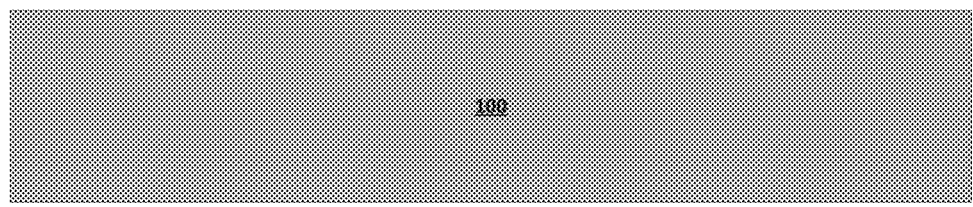
FIG. 1 shows a substrate useful in a process for developing the structures of the present disclosure.
Figure 2:
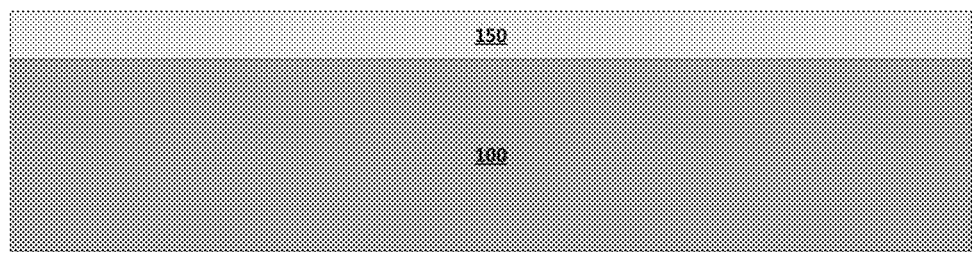
FIG. 2 shows an optical semiconductor material layer over the substrate of FIG. 1.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Conventional manufacturing techniques used for fabricating III-Nitride based photodiodes, including photodetectors, suffer from several notable drawbacks, including an inability to fully exploit the benefits of relatively low crystalline defect density ($\sim 10^6$ dislocations/cm$^2$) found in bulk or "free-standing" aluminum nitride (AlN), aluminum-gallium nitride (AlGaN) and/or gallium nitride (GaN) substrates, while permitting efficient backside (e.g., n-doped side) illumination. It has been observed that the efficiency of III-Nitride based avalanche photodetectors (APD) is improved when optical illumination is incident on the n-doped side of the p/n (or p-i-n) junction. The n-doped layer, however, is normally closer to (or located at) the buried substrate interface during epitaxial growth of the diode structure. If a photodiode device is created with an AlGaN or GaN layer grown on sapphire, the epitaxial mismatch between the sapphire and gallium based material results in very high crystalline defect density (~$10^8$ or more dislocations/cm$^2$) leading to significant reverse leakage current and reduced conversion efficiency, although the UV-transparency of the sapphire substrate permits illumination of the n-doped junction. In contrast, using a bulk and low defect density gallium based substrate to grow an epitaxially matched device layer thereon will result in significantly improved conversion efficiency, with the drawback of substantially hampering (if not outright prohibiting) rear illumination due to the UV absorption of the bulk substrate. Certain embodiments of the present disclosure, in addition to providing other improvements and addressing other problems, provide a method and structure that can avoid this compromise; namely, a thin gallium based substrate with an epitaxially matched optical device material layer thereon, with a rear handle layer adhered to the substrate, which in combination offers the efficiency of using a low defect density gallium based substrate, e.g. 100, while also allowing for substantial illumination, e.g. at the n-doped portion of the device.

According to certain aspects of certain embodiments, substrate electroplating is used to obviate the need for substrate bonding and/or growth of epitaxially mismatched surfaces. This approach is athermal (i.e., does not involve heating), insensitive to particulates, potentially much less expensive than TLP-type bonding, and can allow for, but does not require, epitaxial growth on surfaces. Several exemplary embodiments of the present techniques are now described by way of reference to FIGS. 1-7.

To begin the process, an optical device semiconductor material layer 150 is provided on a substrate 100. See FIG. 1 and FIG. 2. In a broad sense, the optical device semiconductor material layer 150 can form the base device or active device layer, e.g., the base material for forming the junction, for constructing any type of photodiode structure. In another sense, the optical device semiconductor material layer 150 can be a completed stack for a photodiode device. In a specific example, as discussed below, the optical device semiconductor material layer 150 will form as the base layer or active layer, e.g., the base material for forming the junction, of an avalanche photodetector structure. Thus, it is to be appreciated that certain embodiments of the present disclosure are useful for any photodiode structure where spalling provides an advantage, a thin substrate is preferred, and/or a rear illumination layer is useful; however, the present embodiments are not limited to a particular photodiode structure configuration, such as an avalanche photodetector, even though with respect to an avalanche photodetector, the teachings of the present disclosure may provide additional benefits not expressly identified as such.

By way of example only, the optical device semiconductor material layer 150 can be composed of gallium nitride (GaN), aluminum-gallium-nitride (AlGaN), or aluminum nitride (AlN) including bulk and low defect density versions of the same. The optical device semiconductor material layer 150 can be provided on the substrate 100 using several techniques, including epitaxial techniques, chemical vapor deposition (CVD), etc. In one embodiment, the substrate 100 is low defect density bulk GaN, low defect density bulk AlGaN or low defect density AlN, and the optical device semiconductor material layer 150 is epitaxially grown and epitaxially matched in relation to the substrate 100. According to this embodiment, the optical device semiconductor material layer 150 is also composed of either GaN, AlGaN, or AlN, and may further contain one or more heterostructure, or quantum-well layers containing one or more of the elements In, Ga or Al. The semiconductor material layer 150 can be deposited or developed using suitable techniques, including metalorganic chemical vapor deposition (MOCVD) and molecular beam epitaxy (MBE), with a non-limiting example of metalorganic precursors and a carrier gas suitable for epitaxially forming layer 150 being trimethylgallium and/or trimethylaluminum and/or trimethylindium in conjunction with ammonia (NH3). Since the general conditions for growth of these device semiconductor materials on a bulk GaN or AlGaN substrate are known to those of skill in the art, they are not described in further detail herein. Thus, according to an embodiment, the substrate 100 is a bulk GaN, bulk AlGaN, or bulk AlN substrate on which the optical device semiconductor material layer 150 is epitaxially grown and matched in relation thereto, and is also composed of GaN, AlGaN or AlN. In this instance, the substrate 100 may also be referred to herein as a "growth substrate."

An example will be provided below where the present techniques are implemented in the production of an avalanche photodetector. In that example, one or more additional optical device (active/contact) layers will be formed as a stack on the semiconductor material 150, and pursuant to at least one embodiment, the one or more optical device will include a n-type and/or p-type doped region. Thus, as stated, the depiction of a single layer of optical device semiconductor material 150 in FIGS. 1-7 is provided merely as one example of how the present techniques are performed.

Next, a first handle layer is used to remove at least a portion of the optical device semiconductor material layer 150 from the substrate 100. According to an embodiment, a controlled spalling process is used to remove the optical device semiconductor material layer 150 (or a portion thereof) from the substrate 100. The process of substrate spalling is described, for example, in U.S. Pat. No. 8,247,261 by Bedell et al., entitled "Thin Substrate Fabrication Using Stress-Induced Substrate Spalling" (hereinafter "U.S. Pat. No. 8,247,261") the contents of which are incorporated by reference as if fully set forth herein. As described in U.S. Pat. No. 8,247,261, substrate spalling involves depositing a layer of metal under tensile strain on the surface of a substrate and, if this 'stressor layer' is made thick enough, stress at the edge of the stressor layer/source substrate interface exceeds the fracture strength of the substrate and a fracture propagates into the source substrate (the source substrate in this case being the optical device semiconductor material, e.g. 150) at a distance below, and parallel to, the surface of the source substrate. Accordingly, a portion of the source substrate surface attached to the stressor layer can be peeled off the source substrate.

Figure 3:
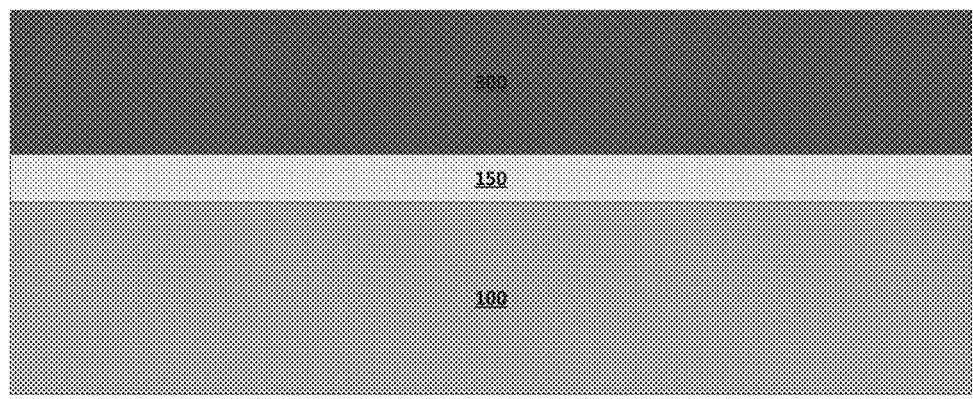
FIG. 3 shows attaching a metal stressor layer to an optical device structure in accordance with at least one embodiment of the present disclosure, including for the structure shown in FIG. 2.

Specifically, as shown in FIG. 3, a stressor layer 300 is formed on top of the optical device semiconductor material layer 150 opposite the substrate 100. According to an embodiment, the stressor layer 300 is formed by depositing one or more metal (stressor) layers on the optical device semiconductor material layer 150. Suitable metals for forming the stressor layer 300 include, but are not limited to, nickel (Ni), titanium (Ti), cobalt (Co), chromium (Cr) and/or iron (Fe) and combinations thereof. According to an embodiment, the stressor layer 300 is deposited on the optical device semiconductor material layer 150 using evaporation, sputtering, electrodeposition, or combinations thereof. The stressor layer 300 can be formed to a thickness that is less than that at which spontaneous spalling occurs, but thick enough to permit mechanically assisted spalling to occur (such as when the first handle layer is pulled away from the substrate 100—see below). By way of example only, a stressor layer 300 having a thickness of from about 1 μm to about 50 μm, and ranges therebetween, meets this requirement. Furthermore, the stressor layer 300 is selected, in relation to the material that it will be applied to, such that it can exert sufficient stress on the underlying substrate 100. This allows better spalling as the optical semiconductor material layer 150 and a portion of the substrate 100A are removed from the rest of the substrate 100B when the process is commenced. In one embodiment, when the substrate 100 and optical semiconductor material layer 150 are composed of GaN, AlGaN or AlN, the stressor layer will be Ni or Ni based. In one embodiment, once spalled, the GaN, AlGaN or AlN substrate is thin (e.g., has a thickness less than or equal to 40 μm), and in another embodiment the GaN, AlGaN or AlN substrate is between 10 μm and 20 μm thick. In one embodiment, the Ni stressor that can be used for spalling the substrate 100 (which can be a GaN, AlGaN or AlN layer) is formed, at room temperature, using $NiCl_2$ (nickel chloride) at 300 g/l with boric acid ($BH_3O_3$) at 10 g/l where in one embodiment, the formation is of thickness of from 5 μm to 30 μm. This results in a mechanically strong material that can exert a very high tensile stress (400-600 MPa) on the underlying layers, such that the remaining GaN substrate 100B is thin enough, but also intact and uncompromised, so that when a rear handle layer, which offers suitable illuminative properties, is added (see below), the benefits of the rear handle layer are realized, while also preserving the benefits inherent with using certain substrate materials, including GaN, AlGaN or AlN. In one embodiment, the addition of Cl-containing chemical species to the above-mentioned formulation, such as 10 g/l of ammonium chloride ($NH_4Cl$), serves to increase the tensile stress in the deposited Ni by 50-60% thereby permitting the use of a thinner Ni stressor layer and subsequently thinner spalled substrate thickness.

Optionally an adhesion layer (not shown) may be used between the optical device semiconductor material layer 150 and the stressor layer 300. Suitable materials for forming the adhesion layer include, but are not limited to, titanium (Ti), tungsten (W), Cr and/or Ni. According to an embodiment, the adhesion layer has a thickness of about 5 nm to about 500 nm, and ranges therebetween. When an adhesion layer is present, the stressor layer 300 may also be deposited using an electroplating process. For example, evaporation or sputtering may be employed to deposit the adhesion layer on the optical device semiconductor material layer 150. The stressor layer can then be electroplated onto top of the adhesion layer.

Figure 4:
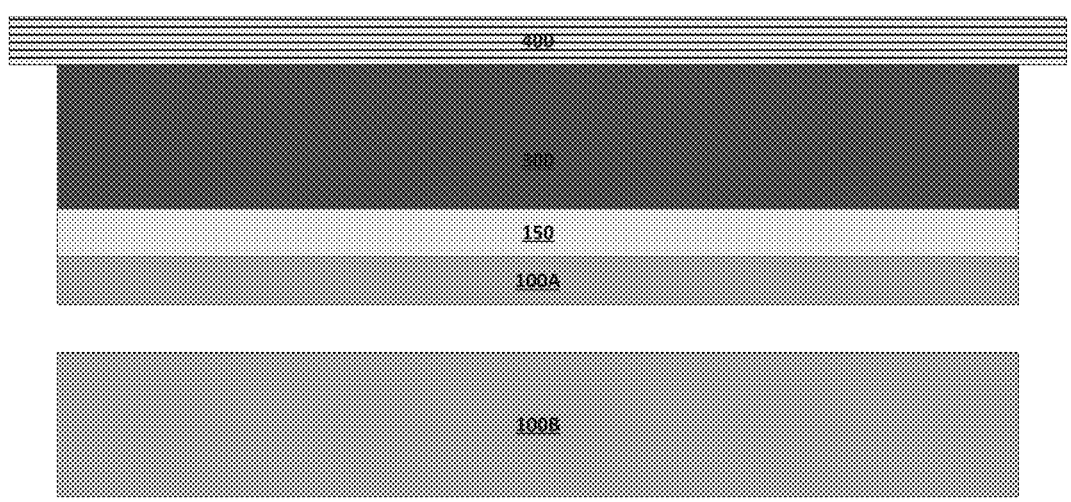
FIG. 4 shows attaching a first handle layer to the structure of FIG. 3.

Next, as shown in FIG. 4, a first handle layer 400 is attached to the stressor layer 300. As provided above, this first handle layer 400 will permit, via the stressor layer 300, at least a portion of the substrate 100A and the optical device semiconductor material layer 150 to be removed from the remaining portion of the substrate 100. According to an embodiment, the first handle layer 400 is formed from a pressure-sensitive adhesive tape, such as a metal or plastic foil that is bonded to the stressor layer 300 using for example silicone or acrylic based pressure-sensitive adhesives, epoxy resin, thermocompression bonding, etc. According to other embodiments, the handle layer 400 can be formed from a polymeric material, such as a polyimide, polyethylene terephthalate (PET), polycarbonates, ethylene polymers and copolymers, or fluorocarbon polymers and copolymers. Further, any of these polymeric handle materials may be coupled with a pressure-sensitive adhesive, so as to form a pressure-sensitive adhesive tape which can be applied to the stressor layer 300. In one embodiment, the adhesive used is releasable (thermally-, UV-releasable, etc.) to permit easier removal (if so desired) later in the process. As such, according to an embodiment, the handle layer 400 can be bonded to the stressor layer 300 layer using, for example, pressure-sensitive tape. Many commercially available tapes are thermally releasable, and thus heat can be applied to the stack (according to the manufacturer's specifications) to release the handle layer 400 from the stressor layer 300. Any other suitable techniques known in the art for removing the handle layer 400 from the stressor layer 300 may be similarly employed, e.g., use of a UV releasable adhesive, etc.

Furthermore, as shown in FIG. 4, mechanically assisted spalling is used to remove (i.e., peel off) at least a portion of the optical device semiconductor material layer 150 from the substrate 100. Namely by pulling the first handle layer 400 away from the substrate 100, the stressor layer 300 and optical device semiconductor material layer 150 attached thereto can be peeled off the substrate 100. As shown, after spalling, a portion of the substrate 100A remains attached to the optical device semiconductor material layer 150. Accordingly, with removal of the other portion of the substrate 100B, a thinner portion of the original substrate 100 remains in place.

In one embodiment, a frame (not shown) (e.g., a commercially available wafer frame or other suitable support structure), optional adhesion layer (not shown), is placed on the handle layer 400 and around the stressor layer 300/optical device semiconductor material layer 150. The frame, optional adhesion layer, or other intermediate layer can offer additional support for the other layers during the subsequent processing steps.

Figure 5:
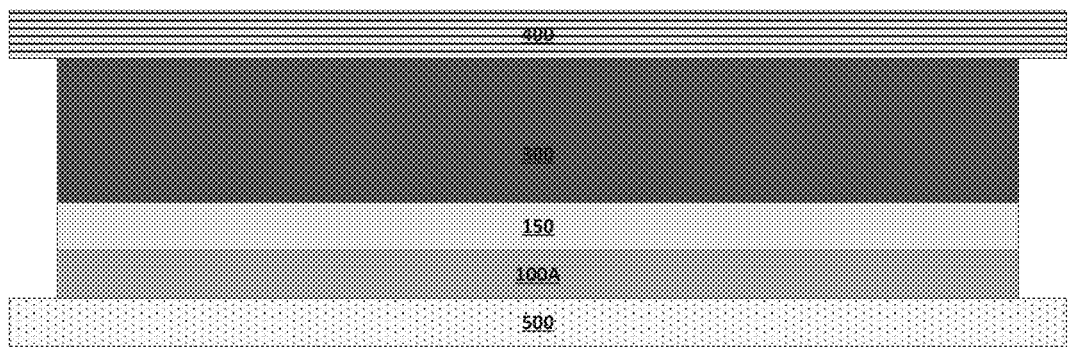
FIG. 5 shows a portion of a spalling process of at least one embodiment of the present disclosure, including as applied to FIG. 4.

FIG. 5 illustrates attaching a second or rear handle layer 500 suitable for illumination is attached to the spalled portion of the substrate 100A. The rear handle layer 500 can be a rigid material, such as sapphire ($Al_2O_3$), including UV transparent sapphire or UV transparent glass, and can be applied using direct wafer bonding techniques, including oxide-oxide bonding or plasma wafer bonding, and as otherwise may be suitable, in order to adhere the rear handle layer 500 to the spalled portion of the substrate 100A. In another embodiment, the rear handling layer 500 is a thin and/or flexible material, such as a thermoset plastic (e.g., polyethylene terephthalate (PET)), and UV transparent adhesives or epoxies can be used to attach the rear handle material to the spalled portion of the substrate 100A. Examples of UV epoxies include EPO-TEK 305 adhesives, silicone compounds and polysiloxanes. In certain embodiments, these adhesives can also be used in conjunction with a rigid material, such as sapphire. In one embodiment, the thickness of the adhesive is between 25 μm and 50 μm. The handling material itself (apart from the adhesive) can also be a scintillation crystal material, which can be bonded to the substrate, such as sodium iodide (NaI), bismuth germanate (BGO), lutetium-yttrium oxyorthosilicate (LYSO), barium-fluoride, cesium fluoride (CsF), gadolinium-oxysulfide ($Gd_2O_2S$), bismuth germanate (BGO), calcium-fluoride ($CaF_2$), cadmium tungstate ($CdWO_4$), or a thin film scintillation material such as EJ-214, etc. Bonding of the scintillation material can be achieved using the above-mentioned UV transparent epoxies, silicones and polysiloxanes. In one embodiment, the rear handle layer can be just the adhesive material itself without more, provided it is sufficiently UV transparent for the particular application sought.

An advantage of adding the rear handle layer 500 to the substrate, after the substrate is spalled, is that the spalled substrate is sufficiently thin so that rear illumination can occur and/or is enhanced, without compromising efficiency. This is particularly useful when the substrate 100 is composed of low defect density bulk GaN and/or AlGaN for any one or all of the following reasons: it permits an epitaxial matched optical semiconductor material layer 150 to the gallium based substrate 100, it can thin the substrate 100 without introducing defects into the substrate, and the thin substrate can accommodate rear illumination in an efficient manner, e.g. there is no bulk thickness that compromises transparency. Although, per one embodiment, the rear handle layer 500 can be added prior to the removal of the stressor layer 300 and first handle layer 400, as doing so provides additional mechanical support to the overall structure, in another embodiment (not shown), it can be removed after the stressor layer 300 and first handle layer 400 have been removed.

Figure 6:
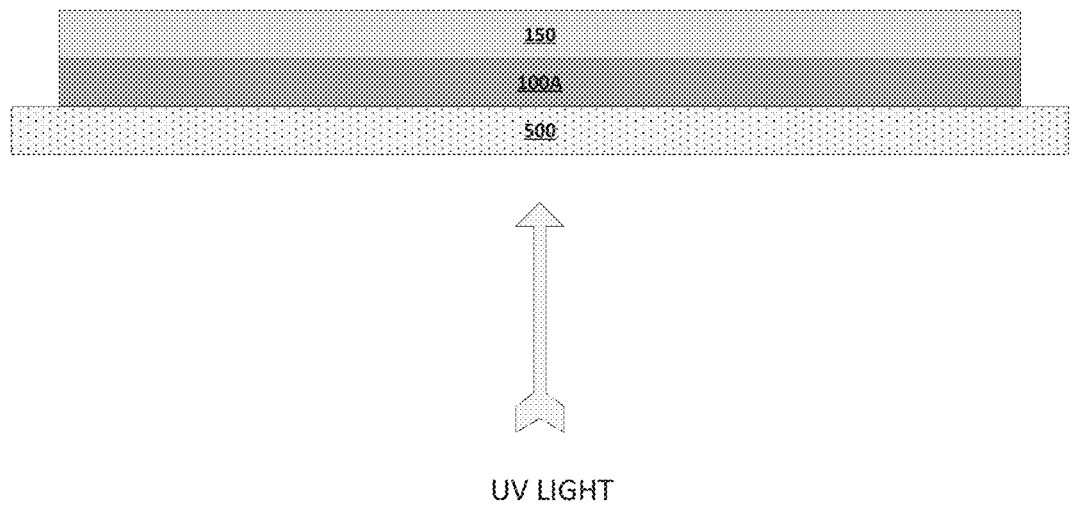
FIG. 6 shows removal of layers useful in a spalling process of at least one embodiment of the present disclosure, including with respect to the structure of FIG. 5.

FIG. 6 illustrates the structure of FIG. 5 after removal of the handle layer 400, the stressor layer 300, and any intermediate layers therebetween from the rest of the structure takes place. In FIG. 6, no intermediate layers are explicitly shown therein. After spalling, the handle layer 400, the stressor layer 300 and any optional metal-containing layer can be removed utilizing conventional techniques well known to those skilled in the art. For example, and in one embodiment, aqua regia ($HNO_3$/HCl) can be used for removing the handle layer 400, the stressor layer 300 and any optional metal-containing layers from the remaining structure. In another example, a polyimide or metal foil constitutes an optional intermediate handle layer (not shown) between the handle layer 400 and the stressor layer 300, and UV or heat treatment can be used to establish the removal of the handle layer 400, followed by a chemical etch to remove the stressor layer 300, and then followed by a different chemical etch to remove any optional metal-containing adhesion layer. The optional handle substrate can be initially employed to provide a firmer adhesion between the stressor layer 300 and the first handle layer 400.

The final structure as shown in FIG. 6 permits efficient and substantial rear illumination, where on one embodiment UV light is applied through the rear handle layer 500 as shown.

As highlighted above, one exemplary implementation of the present techniques contemplated herein is in the production of an avalanche photodetector. An exemplary methodology for forming an avalanche photodetector in accordance with the present techniques is now described by way of reference to FIG. 7. In this example, the avalanche photodetector will include an active layer, e.g. junction layer, which is in contact with one or both of an n-type contact or p-type contact and over a GaN, AlGaN or AlN substrate, which in turn can be in contact with an opposite type of contact than the contact contacting the substrate. According to an embodiment, each of the active or optical semiconductor material layers, e.g. 150, and the substrate will be formed from GaN, AlGaN or AlN, where the former will be formed on the substrate using an epitaxial growth process such that the substrate and the device or optical semiconductor material layer, e.g. 150, are epitaxially matched. Epitaxial growth of these optical device semiconductor materials can be templated from a lattice-matched (i.e., growth) substrate—such as substrate 100 in the above example. As provided above, bulk GaN, AlGaN or AlN for example, are suitable growth substrates for the present GaN, AlGaN or AlN-based optical device semiconductor materials.

Figure 7:
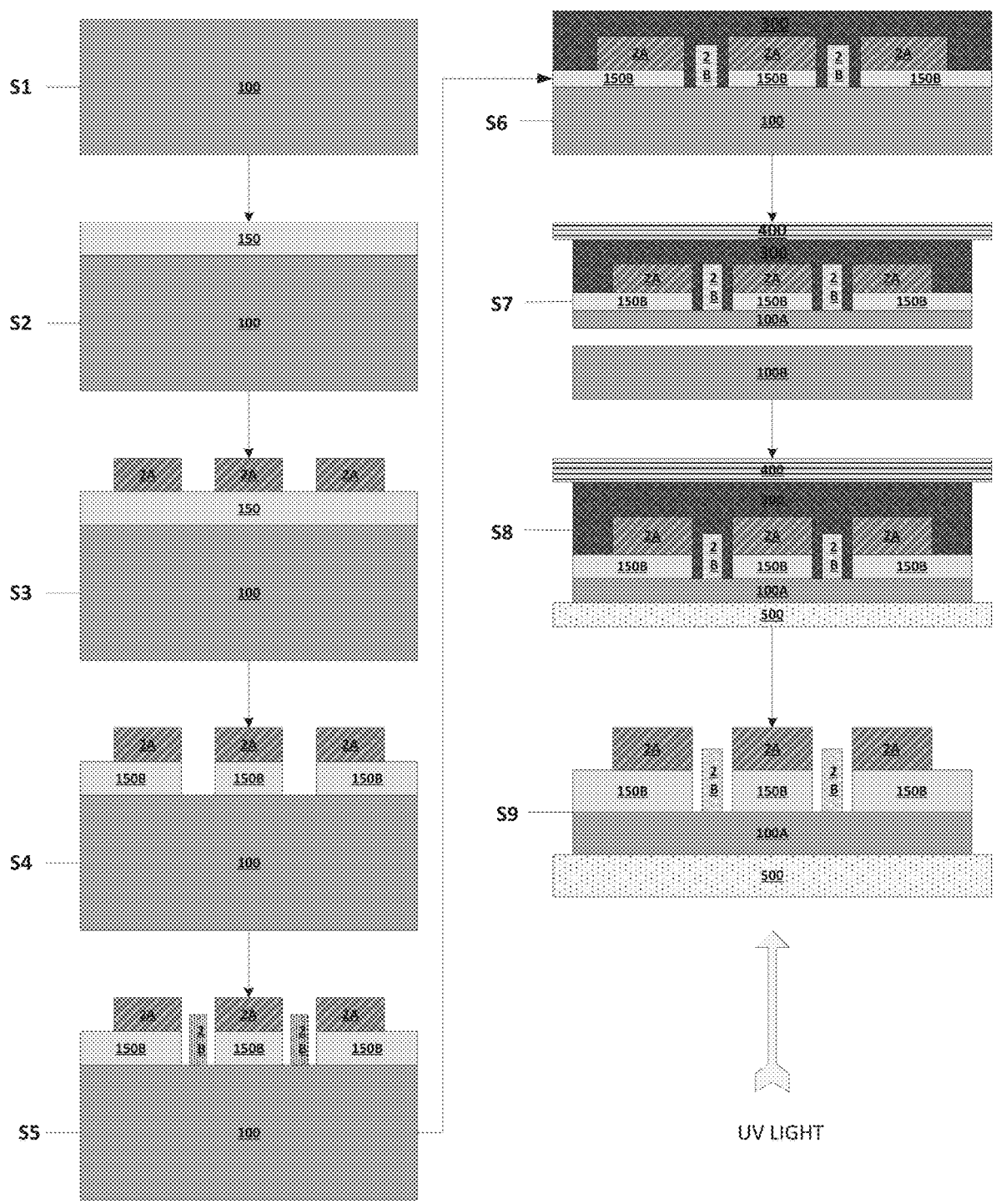
FIG. 7 shows a process flow for developing a photodiode device in accordance with at least one embodiment of the present disclosure.

For clarity and consistency, in the process depicted in FIG. 7, like structures are given the same reference numerals as in the previous figures, even though the layers of the above Figures may contemplate broader or different embodiments than those described hereafter. As shown in FIG. 7, the process begins in steps S1 and S2 with the same starting structure as above, namely an optical device semiconductor material layer 150 made of GaN, AlGaN or AlN on a GaN, AlGaN or AlN substrate 100 and lattice matched in relation thereto. According to an embodiment, the substrate 100 is a growth substrate, such as a bulk GaN, AlGaN or AlN substrate 100, and the optical device semiconductor material layer 150 is grown on the substrate 100 (using, e.g., epitaxy, CVD, etc.). In one embodiment, the substrate 100 is GaN or AlGaN layer is between 100 um and 1 cm, and after the spalling process as described below, it is thin (less than or equal to 40 μm), and in another embodiment, after spalling, the substrate is GaN, AlN, or AlGaN and is between 10 μm and 20 μm.

By contrast to the embodiment presented above, in steps S3-S5, multiple active/contact layers, e.g. 2A, of the photodiode stack are next formed on the optical device semiconductor material layer 150. In the example shown in FIG. 7, the optical semiconductor material layer 150 can form the basis for the junction layer of the photodetector device, and depending on the configuration sought and the contacts that are ultimately used, it can be p-doped, n-doped or un-doped. According to an embodiment, optical device semiconductor material layer 150 is a p-i-n vertical diode structure with, as described below, an n-doped region (Si or Ge doped) formed near the bottom during growth, an un-doped region formed thereupon, and a p-doped region (Mg-doped) at the surface formed during growth. As shown in S3, p-contacts 2A are deposited over the optical semiconductor material layer 150. The p-contacts 2A can be deposited using suitable direct deposition techniques, including but not limited to PVD (physical vapor deposition), and can be a metal including nickel (Ni) and gold (Au), palladium (Pd) and Au (gold), and/or Ni and Ag (silver) or any other known p-ohmic contacts 2A to a III-Nitride material, such as GaN. In one embodiment, the p-type impurity in the p-doped region of optical semiconductor material layer 150 can be magnesium (Mg) and at a concentration of $\sim 10^{19}/cm^3$. Thereafter, as shown in S4, the optical device semiconductor material layer 150 is etched using suitable techniques, such as RIE (reactive ion etching) using halogen containing gases to create opening for n-contacts 2B. The n-contacts 2B can be a metal that include titanium (Ti), aluminum (AL), Ni, or Au or any other suitable n-type material suitable for a III-Nitride material, with the n-type impurity being formed during growth using silane or germane as precursors. In one embodiment, the n-type impurity can be Si and at a concentration of $\sim 10^{20}/cm^3$. This stack of layers and contacts 150, 100, 2A, and 2B of optical device semiconductor materials and metals over the substrate forms the photodetector stack.

Next, as shown in S6 and S7, a first handle layer 400 is used to remove active/contact layers 2A-2B and at least a portion of the optical device semiconductor material layer 150, a portion of the substrate 100A from the remaining substrate 100B, and any intermediary layers between said layers, e.g., a spalling process.

The details of a spalling process were provided above. In general, as shown in S6, a metal stressor layer 300 (e.g., Ni, Co, Cr, and/or Fe) is formed (e.g., using evaporation or sputtering) on the photodetector stack, e.g. layer 150 and contacts 2A and 2B. As detailed above, the stressor layer 300 can be formed to a thickness that is less than that at which spontaneous spalling occurs, but thick enough to permit mechanically assisted spalling to occur (such as when the first handle layer 400 is pulled away from the substrate 100—see below). By way of example only, in one embodiment, a stressor layer 300 having a thickness of from about 1 µm to about 50 µm, and ranges therebetween, meets this requirement. Optionally, an adhesion layer (not shown) (e.g., a Ti, W, Cr and/or Ni layer) may be used between the optical device semiconductor material layer 150 and the stressor layer 300. According to an embodiment, the adhesion layer has a thickness of from about 5 nm to about 500 nm, and ranges therebetween. As provided above, when the optional adhesion layer is present, the stressor layer 300 can also be electroplated onto the adhesion layer. In one embodiment, the Ni composition that can be used for spalling a substrate layer is formed, at room temperature, using $NiCl_2$ (nickel chloride) at 300 g/l with boric acid ($BH_3O_3$) at 10 g/l (and optionally ammonium-chloride ($NH_4Cl$) at 10 g/l) and plated between 20 and 100 mA/cm2.

In step S7, mechanically assisted spalling is used to peel off the active/contact layers 2A and 2B, optical device semiconductor material layer 150, a portion of the substrate 100A (e.g., the photodetector stack) from the remaining substrate 100B. Namely by pulling the first handle layer 400 away from the substrate 100, the stressor layer 300 and the active/contact layers 2A-2B and optical device semiconductor material layer 150 attached thereto can be peeled off the substrate 100.

In S8, as discussed above, a second or rear handle layer 500 suitable for illumination is attached to the remaining portion of the substrate 100A. The rear handle layer 500 can be a rigid material, such sapphire ($Al_2O_3$), such as UV transparent sapphire, or UV transparent glass, and can be applied using direct wafer bonding techniques, including oxide-oxide bonding or plasma wafer bonding, and as otherwise may be suitable in order to adhere the rear handle layer 500A to the spalled portion of the substrate 100A. In another embodiment, the rear handling layer 500 is a thin and/or flexible material, such as a thermoset plastic (e.g., polyethylene terephthalate (PET)), and UV transparent adhesives or epoxies can be used to attach the rear handle material. Examples of UV epoxies include EPO-TEK 305 adhesives, silicone compounds and polysiloxanes. In certain embodiments, these adhesives can also be used in conjunction with a rigid material, such as sapphire. In one embodiment, the thickness of the adhesive is between 25 µm and 50 µm. The handling material itself (apart from the adhesive) can also be a scintillation crystal material, which can be bonded to the substrate, such as sodium iodide (NaI), bismuth germanate (BGO), lutetium-yttrium oxyorthosilicate (LYSO), barium-fluoride, cesium fluoride (CsF), gadolinium-oxysulfide (Gd2O2S), bismuth germanate (BGO), calcium-fluoride (CaF2), cadmium tungstate (CdWO4), a thin film scintillation material such as EJ-214, etc. In one embodiment, the rear handle layer 500 can be just the adhesive material itself without more, provided it is sufficiently UV transparent for the particular application sought.

In step S9, the final photodetector structure is revealed once the handle layer 400, the stressor layer 300 and any optional metal-containing layer are removed from the remaining structure. The removal is facilitated using conventional techniques well known to those skilled in the art. For example, as stated above, and in one embodiment, aqua regia ($HNO_3$/HCl) can be used for removing the handle layer 400, the stressor layer 300 and any optional metal-containing layers from the spalled portion 100A of the substrate 100. In another example, a polyimide or metal foil constitutes an optional intermediate handle layer (not shown) between the handle layer 400 and the stressor layer 300, and UV or heat treatment can be used to remove this optional handle substrate followed by a chemical etch to remove the stressor layer 400, followed by a different chemical etch to remove any optional metal-containing adhesion layer. The optional handle substrate can be initially employed to provide a firmer adhesion between the stressor layer 300 and the first handle layer 400.

According to one embodiment, and in accordance with the teachings of the present disclosure, the final structure illustrated at S9 can be such that the substrate 100 and the remaining, post-spalled, substrate 100A are made of GaN. The optical semiconductor material layer 150 is also a GaN layer, with the p-contact 2A being a metal that includes one of i) one of or both of Ni and Ag and ii) one of or both of Ni and Au and the n-contact 2B being a metal that includes at least one of or all of Ti, Al, Ni, or Au. The spalled portion of the substrate 100A can be substantially thinner from the original thickness of the substrate 100, e.g. less than or equal to 40 µm, without introducing defects, as a result of the spalling process, which in turn allows for the second or rear handle layer 500 to be adhered thereto, where the second handle layer 500 is made of UV transparent sapphire, while also ensuring that the optical device semiconductor material layer 150 is epitaxially matched in relation to the substrate. As shown, the structure provides for efficient and substantial UV illumination and transmission via the rear portion of the structure. Thus, in contrast to previous techniques, the avalanche photodetector in accordance with this embodiment can take advantage of the benefits of a low defect density GaN substrate layer and epitaxially matched GaN optical device material layer in relation thereto, while also allowing for substantial illumination as offered by the UV-transparent rear handle layer 500.

As is evident from the above description, the photodiodes manufactured using certain embodiments of the present disclosure can employ thin, low defect density substrates with epitaxially matched device layers, while also employing rear handle layers that provide significant illumination. By comparison, with conventional techniques, either preferred substrate materials would prohibit use of a rear illumination layer or a rear illumination layer would prohibit fully using the benefits of a preferred substrate and/or device layer.

Although illustrative embodiments of the present application have been described herein, it is to be understood that the invention is not limited to those precise embodiments, and that various other changes and modifications may be made by one skilled in the art without departing from the scope of the invention. Furthermore, while the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A method for forming an optical semiconductor device, the method comprising:

forming an optical device semiconductor material layer on a substrate;

depositing a metal stressor layer on top of the optical device semiconductor material layer;

attaching a first handle layer to the metal stressor layer;

removing the optical device semiconductor material layer from the substrate by pulling the first handle layer away from the substrate and with it a stack comprising the metal stressor layer and a portion of the substrate;

removing the first handle layer and the metal stressor layer from the stack; and forming a second handle layer on the remaining portion of the substrate, wherein the second handle layer is UV transparent.

2. The method of claim 1, wherein the attaching the second handle layer comprises:

bonding a UV transparent adhesive to the portion of the substrate, wherein the UV transparent adhesive is the second handle layer suitable for illumination.

3. The method of claim 2, wherein the attaching the second handle layer comprises:

bonding, with a UV transparent adhesive, the second handle layer to the portion of the substrate, wherein the second handle layer is one of: i) a sapphire layer, ii) a UV transparent glass layer, iii) a thermoplastic layer, and iv) a crystalline or non-crystalline scintillation layer.

4. The method of claim 3, wherein the second handle layer is a sapphire layer.

5. A method for forming a photodiode device, the method comprising:

forming a photodiode material stack over a substrate, which includes at least one optical device material layer;

depositing a metal stressor layer on top of the photodiode material stack, wherein the metal stressor layer is deposited to a thickness sufficient to permit mechanically-assisted spalling of the optical device semiconductor material layer to occur;

attaching a first handle layer to the metal stressor layer;

removing the photodiode material stack, the optical device semiconductor material layer, and a portion of the substrate from a remainder of the substrate by pulling the first handle layer away from the substrate; and attaching a second handle layer to the portion of the substrate, wherein the second handle layer is suitable for illumination.

6. The method of claim 5, wherein the attaching the second handle layer comprises:

bonding a UV transparent adhesive to the portion of the substrate, wherein the UV transparent adhesive is the second handle layer suitable for illumination.

7. The method of claim 6, wherein the attaching the second handle layer comprises:

bonding, with a UV transparent adhesive, the second handle layer to the portion of the substrate, wherein the second handle layer is one of: i) a sapphire layer, ii) a UV transparent glass layer, iii) a thermoplastic layer, and iv) a scintillation material layer.

8. The method of claim 7, wherein the second handle layer is a sapphire layer.

9. The method of claim 8, wherein the forming a photodiode material stack on top of the optical device semiconductor material layer comprises:

forming a p-contact over the optical device semiconductor material layer;

etching at least one portion of the optical semiconductor material layer to expose a portion of the portion of the substrate; and depositing an n-contact over the portion of the substrate.

10. The method of claim 9, wherein the depositing a metal stressor layer on top of the photodiode material stack, wherein the metal stressor layer is deposited to a thickness sufficient to permit mechanically-assisted spalling of the optical device semiconductor material layer to occur comprises:

depositing the metal stressor layer over the p-contact, n-contact, and the portion of the the optical semiconductor material layer.

11. The method of claim 10, wherein the metal stressor layer is a Ni layer.

12. The method of claim 11, wherein the substrate, after spalling, is between 10 µm and 40 µm.

13. The method of claim 12, wherein the spalled substrate and the optical semiconductor material layer are epitaxially matched.

* * * * *